(12) United States Patent
Aakjer

(10) Patent No.: US 7,079,447 B2
(45) Date of Patent: Jul. 18, 2006

(54) DYNAMICAL ADAPTATION OF MEMORY SENSE ELECTRONICS

(75) Inventor: Thomas Aakjer, Munich (DE)

(73) Assignee: Dialog Semiconductor GmbH, Kirchheim-Kabern (DE)

( * ) Notice: Subject to any disclaimer, the term of this patent is extended or adjusted under 35 U.S.C. 154(b) by 100 days.

(21) Appl. No.: 10/970,784

(22) Filed: Oct. 21, 2004

(65) Prior Publication Data

US 2006/0083092 A1    Apr. 20, 2006

(30) Foreign Application Priority Data

Oct. 18, 2004    (EP) ................................. 04368067

(51) Int. Cl.
*G11C 8/00* (2006.01)
(52) U.S. Cl. .................... 365/233; 365/205; 365/233.5
(58) Field of Classification Search ................ 365/233, 365/205, 207, 233.5, 227
See application file for complete search history.

(56) References Cited

U.S. PATENT DOCUMENTS

| | | | |
|---|---|---|---|
| 5,596,544 A * | 1/1997 | Komarek et al. ......... | 365/233.5 |
| 5,684,750 A | 11/1997 | Kondoh et al. ............. | 365/205 |
| 5,907,517 A * | 5/1999 | Komarek et al. ........... | 365/210 |
| 6,049,251 A | 4/2000 | Meyer ........................ | 330/254 |
| 6,205,072 B1 | 3/2001 | Jung ........................ | 365/207 |
| 6,584,037 B1 * | 6/2003 | Farmwald et al. .......... | 365/233 |
| 6,728,151 B1 | 4/2004 | Joo ............................. | 365/205 |
| 6,728,819 B1 | 4/2004 | Farmwald et al. .......... | 710/305 |
| 2004/0114454 A1 * | 6/2004 | Farmwald et al. .......... | 365/233 |

FOREIGN PATENT DOCUMENTS

| EP | 0 499460 A | 8/1992 |
|---|---|---|
| GB | 2 304244 A | 3/1997 |

OTHER PUBLICATIONS

Co-pending U.S. Patent App. Pub. DS-04-017, U.S. Appl. No. 10/898,478, filed Jul. 23, 2004, "Dynamical Biasing of Memory Sense Amplifiers".

"A 36n 1Mbit CMOS EPROM with new data sensing technique," by Nakai et al., 1990 Symp. on VLSI Circuits, IEEE 1990, XP-002322527, pp. 95-96.

* cited by examiner

*Primary Examiner*—Gene N. Auduong

(57) ABSTRACT

A circuit and a method are given, to realize a dynamically adapting response speed behavior of memory sense electronics for Sense Electronics Endowed (SEE) memory devices. Fast memories use sense amplifiers in the read path in order to react fast with the data being delivered from a given address position. In order to achieve short response times, these sense amplifiers are normally responding very fast with accordingly high power consumption. Dynamically reducing the response speed after a certain "on" time of operation will save power for fast memories used in conditions where the utmost speed is not needed. Said circuit and method are designed in order to be implemented with a very economic number of components, capable to be realized with modern integrated circuit technologies.

38 Claims, 9 Drawing Sheets

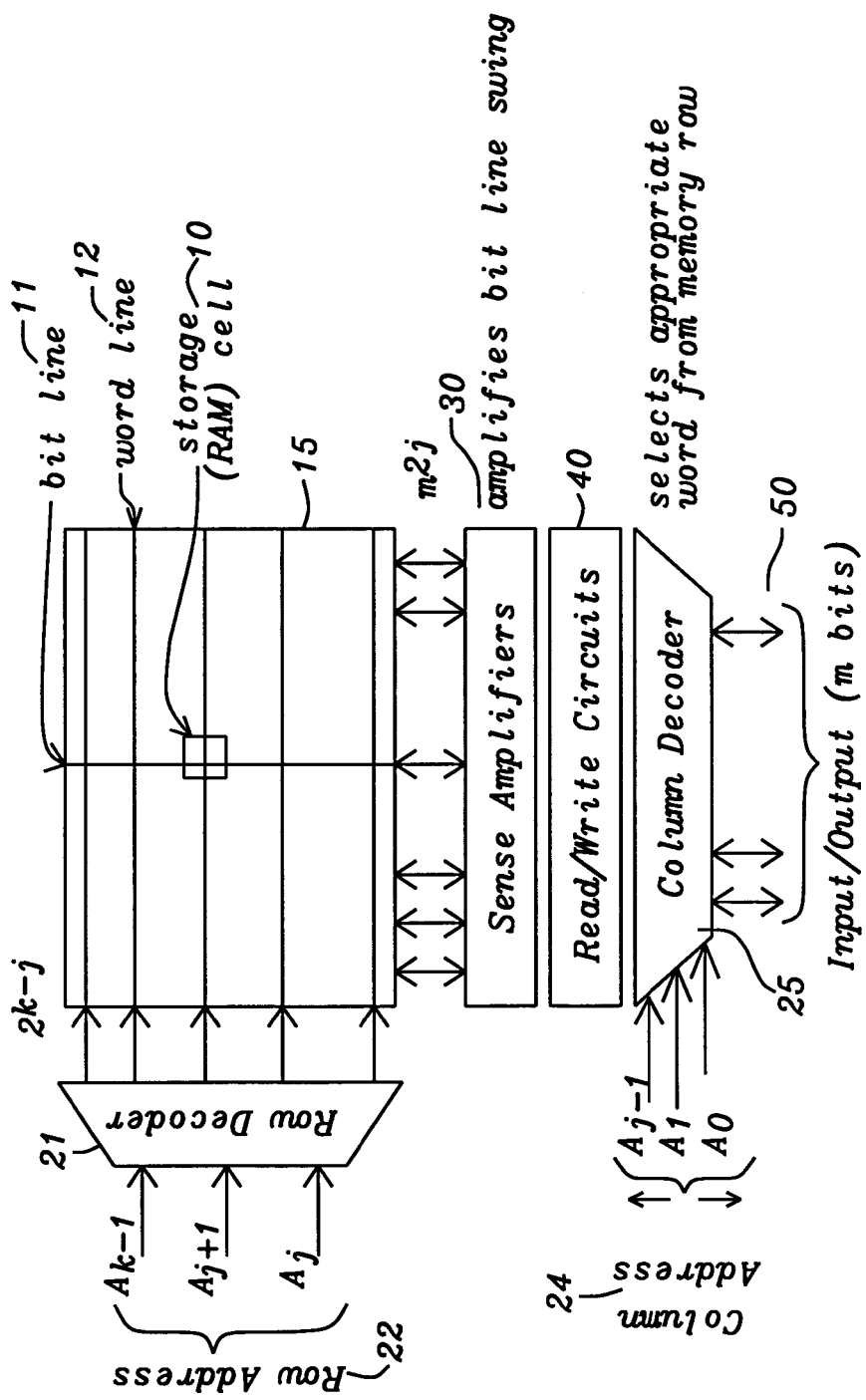
FIG. 1 – Prior Art

DYNAMICAL ADAPTATION OF MEMORY SENSE ELECTRONICS

RELATED PATENT APPLICATION

This application is related to U.S. patent application Ser. No. 10/898,478, filed Jul. 23, 2004, and assigned to the same assignee as the present invention. Title: "Dynamical Biasing of Memory Sense Amplifiers"

BACKGROUND OF THE INVENTION (1) Field of the Invention

The invention relates generally to data storage in semiconductor memory devices and more particularly, to memory devices equipped with sense amplifiers or additional read-out electronics such as Read Only Memory ROM, Flash memory, Random Access Memory (RAM), and also Magnetic RAM (MRAM) or even Ferroelectric RAM (FRAM). These memories are subsumed for brevity under the designation of Sense Electronics Endowed (SEE) memories. Even more particularly this invention is relating to SEE- memory devices with reduced power consumption by dynamically adapting the amplifier characteristics of such sense electronics during read operations of such SEE- memory devices.

(2) Description of the Prior Art

Microprocessor systems can be found nowadays working in many devices, such as Personal Computers (PCs) especially modern portable notebook computers, in Personal Data Assistants (PDAs), mobile phones, navigation systems—mostly also used as portable devices, but also in many household appliances, in automobiles etc. and they all have Central Processing Units (CPUs) which need some sort of Random Access Memory (RAM) for their primary workspace (in RAM the code and data for the CPU are stored) usually implemented as semiconductor memory, wherein the contents of each byte can be directly and randomly accessed. Other types of memory chips, including ROMs and PROMs have this property as well, but only RAM chips are economically priced however they require power to maintain their content. The most common type of computer memory in current solid-state memory technology for main memory storage, which usually uses one transistor and a storage capacitor to represent a bit, is called Dynamic RAM (DRAM). Therein the capacitors must be energized hundreds of times per second in order to maintain the charges, representing the stored information as data. A data bus system is used for moving the information in and out of the RAM storage and an address bus addresses the storage location of the information data within the RAM. The RAM is usually organized in a grid or matrix configuration, where each bit is stored in its own data cell and each row and column has its own address. Another implementation called Static RAM (SRAM) is a type of RAM that holds data without need to refresh the stored content. An SRAM bit is made up of 4 to 8 transistors and is therefore very fast, with access times in the 10 to 30-nanosecond range but also power dissipating and expensive to produce. In comparison, DRAM only uses one transistor per memory cell and has access times, which are usually above 30 ns. SRAM does not require any refreshing operation and is easily handled, but is more expensive than DRAM and has a smaller capacity than DRAM comparing the same chip area. Because of these properties, SRAM is used to create a CPU's speed- sensitive cache, while DRAM is used for the larger system main storage RAM space. The memory internal operations during read, write, and refresh transactions are governed by a number of control signals allowing to strobe or clock addresses and data in and out, and to partially select, enable or inhibit these operations. All these operations are more or less power consuming, which leads especially with portable systems to reduced power-on times, as these systems are dependent from the energy capacity stored in their battery. These considerations hold especially for systems incorporating memory devices equipped with sense amplifiers or additional read-out electronics such as Read Only Memory ROM, Flash memory, Random Access Memory (RAM), and also Magnetic RAM (MRAM) or even Ferroelectric RAM (FRAM). These memories will in the following altogether be subsumed for brevity under the designation of Sense Electronics Endowed (SEE) memories. It is therefore important to reduce power consumption during operation of these systems, and especially the power consumption of the SEE-memory devices.

In the prior art, there are different technical approaches for achieving the goal of a reduction of power consumption. However these approaches use often solutions, which are somewhat technically complex and therefore also expensive in production. It would be advantageous to reduce the expenses in both areas. This is achieved by using a dynamical adaptation of the amplifier characteristics of the memory sense electronics during memory read operations. Using the intrinsic advantages of that solution—as described later on in every detail—the circuit of the invention is realized with standard CMOS technology at low cost.

Preferred prior art realizations are implementing such related memory circuits in single chip or multiple chip solutions as integrated circuits. The permanent high power requirement and therefore high system costs are the main disadvantages of these prior art solutions. It is therefore a challenge for the designer of such devices and circuits to achieve a high-quality but also low-cost solution.

Several prior art inventions referring to such solutions describe related methods, devices and circuits, and there are also several such solutions available with various patents referring to comparable approaches, out of which some are listed in the following:

U.S. Pat. No. 6,049,251 (to Meyer) describes a very-wide-dynamic-range amplifier with very low-noise in the high-gain mode and very high-input-overload in the low-gain mode. The amplifier utilizes two parallel signal paths, one a high-gain, low- noise path and the other a low-gain, high-input-overload path. Each path includes a gain-control capability so that the gain of each path, and the contribution of the gain of each path to the overall gain of the amplifier may be smoothly varied from a very low- gain to a very high-gain. Specific embodiments including input impedance matching capabilities are disclosed.

U.S. Pat. No. 6,728,151 (to Joo) discloses circuits and methods for driving a DRAM sense amplifier having low threshold voltage PMOS transistors are described. The source terminal of a low $V_{tp}$ PMOS transistor is maintained at ground potential during DRAM standby mode. The source terminal of the low $V_{tp}$ PMOS transistor is raised to an intermediate supply voltage responsive to a transition from DRAM standby mode to either DRAM read mode, write mode, or refresh mode and prior to development of a differential voltage between the gate and drain terminals of the low $V_{tp}$ PMOS transistor. These circuits and methods advantageously limit current loss through the low $V_{tp}$ PMOS transistor when the differential voltage develops between the gate and drain terminals of that low V.sub.tp PMOS transistor and in the event of a word line and digital line short-circuit.

U.S. Pat. No. 6,728,819 (to Farmwald et al.) shows a synchronous semiconductor memory device including a memory cell array and a plurality of input receivers to sample address information synchronously with respect to a clock signal. The address information includes a row address and a column address. The memory device further includes a plurality of sense amplifiers to sense data from a row of the memory cell array, the row of the memory cell array being identified by the row address. Furthermore, the memory device includes a plurality of column decoders coupled to the plurality of sense amplifiers to access, based on the column address, a plurality of data bits of the data sensed by the plurality of sense amplifiers. In addition, the memory device includes a plurality of output drivers to output the plurality of data bits, the plurality of output drivers outputs a first portion of the plurality of data bits synchronously with respect to a rising edge transition of the first clock signal, and the plurality of output drivers outputs a second portion of the plurality of data bits synchronously with respect to a falling edge transition of the first clock signal.

The basic RAM circuit is shown in FIG. 1 prior art in form of a modified circuit diagram (i.e. with graphical representation of the memory array as grid layout) with a storage (RAM) cell 10 as central component, wherein the information is stored as a single bit, in this case. Arranging these data storage cells 10 in form of a rectangular grid unfolds the core bit/word (X/Y) organized memory array element, with horizontal rows 12 and vertical columns 11 spanning a storage matrix 15 with Cartesian X and Y coordinates identifying the X/Y data cell location 10 and in such a way setting up the main storage area organized in bits (X) and words (Y). In technical terms the columns are designed as bit lines 11 and the rows as word lines 12, the storage (RAM) cells 10 can be implemented as single transistor-capacitor DRAM or multiple transistor SRAM cells, or even as formerly used magnetic cores or MRAM (Magnetic RAM) devices of late. This memory array is now addressed through the address bus system from the processor CPU with addresses made up of a Row Address 22 part and a Column Address 24 part, the Row Address 22 part being decoded in a Row Decoder 21 and the Column Address 24 part being decoded in the address part of a Column Decoder 25. The Row Decoder 21 is then activating the according word line 12, whereas the address part of the Column Decoder 25 activates the according bit line 11. Depending on the operation to be performed a Write, Read or Refresh cycle for the selected storage (RAM) cell 10 is then executed. Therefore Read/Write Circuits 40 are activated, performing the according bitwise data operations with the help of Sense Amplifiers 30 and acting on the particular storage (RAM) cells 10. The relevant data are delivered via said Column Decoder 25 too, having additionally a data part, connected to the Input/Output data bus system of the CPU. These data are therefore written into or read from the main memory array in parallel with the help of said Column Decoder 25 connected to said Read/Write Circuits 40 and these further connected on their part to said Sense Amplifiers 30 writing or reading the contents of the connected storage (RAM) cells 10. Refresh operations are essentially made up of a combination of Read/Write operations. The length of the address as shown in the figure is k bits and depends on the size of the addressable memory—defining also the bus width of the address bus, and the length of the data word as shown in the figure is M bits and depends on the CPU type—determining also the bus width of the data I/O bus.

Although these patents and papers describe circuits and/or methods close to the field of the invention they differ in essential features from the method, the system and especially the circuit introduced here.

SUMMARY OF THE INVENTION

A principal object of the present invention is to realize a circuit for implementing a dynamical adaptation of memory sense electronics for Sense Electronics Endowed (SEE) memory devices in form of very manufacturable integrated circuits at low cost.

Another principal object of the present invention is to provide an effective and very manufacturable method for implementing a circuit for dynamical adapting memory sense electronics for SEE-memory devices.

Another further object of the present invention is to attain a power loss reduction by dynamical adapting memory sense electronics for SEE-memory devices.

Another still further object of the present invention is to reach an extended power- on time for battery operated microprocessor systems containing devices.

Further another object of the present invention is to give a method featuring the design of a memory circuit, whereby the pulse response and frequency characteristics of sense amplifiers for memory devices are adapted during read mode of a system in such a way, that said memory is only operating at full power and high speed for a fixed time after an address change occurred.

A still further object of the present invention is to reduce the power consumption of battery powered devices by putting into effect design features, resulting from said newly introduced dynamical adaptation of memory sense electronics for SEE-memory devices.

Another further object of the present invention is to reduce the cost of manufacturing by implementing the circuit as a monolithic integrated circuit in low cost CMOS technology.

Also an object of the present invention is to enhance the battery lifetime and at the same time to thereby reach a low-cost realization with modern integrated circuit technologies.

Another still further object of the present invention is to reduce cost by minimizing the chip area by means of effectively minimizing component values.

In accordance with the objects of this invention a new circuit is described, capable of realizing a Sense Electronics Endowed (SEE) memory device with dynamical adaptation of memory sense amplifiers, comprising a memory array for realizing an SEE-memory device with dynamical adapting memory sense electronics using a method for dynamically adapting the amplifier characteristics of such sense electronics during memory read operations with the help of a virtual sense amplifier with response speed control facility controlled by a "System Clock" signal and having external Address and Data I/O bus system connections, a virtual sense amplifier with read data input and output as well as a response speed control input, named furtheron also Select input whereby said Select input control signal is delivered from a Selection Controller unit with an Address Change detect signal input generating a time dependent Select input control signal as output signal, and an address transition detection logic delivering said Address Change detect signal for said Selection Controller unit, whereby said Address Change detect signal is generated from an address being altered on said external Address bus system, then causing the reading of memory data from a memory address location as addressed via said Address bus system with a fully powered virtual sense amplifier and finally putting said memory data on said external data I/O bus, whereas said virtual sense amplifier is now modified into a reduced response speed mode configuration in order to reduce its power consumption according to a dynamical response speed control scheme established within said Selection Controller unit until the next Address Change detect signal is furnished by said address transition detection logic and said dynamical response speed control scheme for application within a read cycle operation governed by said "System Clock" signal; the dynamical response speed control scheme being generated so, that the response speed is controlled by said Address Change detect signal and defined in a time dependent manner reducing after a certain time said response speed characteristic of the virtual sense amplifier.

Also in accordance with the objects of this invention a new method is described, capable of implementing a Sense Electronics Endowed (SEE) memory device with dynamical adapting memory sense amplifiers, comprising especially, providing a memory array for realizing an SEE-memory device with dynamical adapting memory sense electronics using a virtual sense amplifier with response speed control facility controlled by a "System Clock" signal and having external Address and Data I/O bus system connections, then also providing said virtual sense amplifier with read data input and output as well as a response speed control input, named furtheron also Select input, whereby said Select input control signal is delivered from a Selection Controller unit, further providing said Selection Controller unit with Address Change detect signal input generating a time dependent Select input control signal as output signal, also providing an address transition detection logic delivering said Address Change detect signal for said Selection Controller unit, generating a dynamical response speed control scheme for application within a read cycle operation governed by said "System Clock" signal, whereby said Select input signal is controlled by said Address Change detect signal and defined in a time dependent manner in such a way, that after a certain time said response speed of said virtual sense amplifier is reduced, using within said address transition logic said Address Change detect signal from an address being altered on said external Address bus system, then reading memory data from a memory address location as addressed via said Address bus system with a fully powered virtual sense amplifier and putting said memory data on said external data I/O bus, whereas said virtual sense amplifier is now modified into a reduced response speed mode configuration in order to reduce its power consumption according to said dynamical response speed control scheme established within said Selection Controller unit until the next Address Change detect signal is furnished by said address transition detection logic.

BRIEF DESCRIPTION OF THE DRAWINGS

In the accompanying drawings forming a material part of this description, the details of the invention are shown:

FIG. 1 prior art shows the basic RAM circuit in form of a modified circuit diagram (i.e. with a graphical representation of the memory array as grid or matrix layout).

DESCRIPTION OF THE PREFERRED EMBODIMENTS

The preferred embodiment discloses a novel circuit for memory sense amplifiers used within Sense Electronics Endowed (SEE) memory semiconductor storage devices. According to the invention said SEE-memory devices are enhanced by applying a dynamical amplifier response selecting operation with the help of an additional control element. This feature is very useful for modern high-speed memories with their considerable consumption of power in normal operation, whereas the particular need for that elevated power is only necessary during read access. In modern fast memories, the read out path normally contains sense amplifiers, which detect the small changes on the data cell outputs when an address is changed. These small output changes are amplified and make the memory respond with output data very fast. Without the sense amplifiers, the memories would respond with output data much slower as the memory cells would need to charge the internal output data bus before the output drivers would react. Dynamically reducing the response speed after a certain "on" time i.e. normally after an already completed read operation, will save power for fast memories used in conditions where the full speed is not needed, or when the memories are kept active longer than actually needed.

Figure 2A:
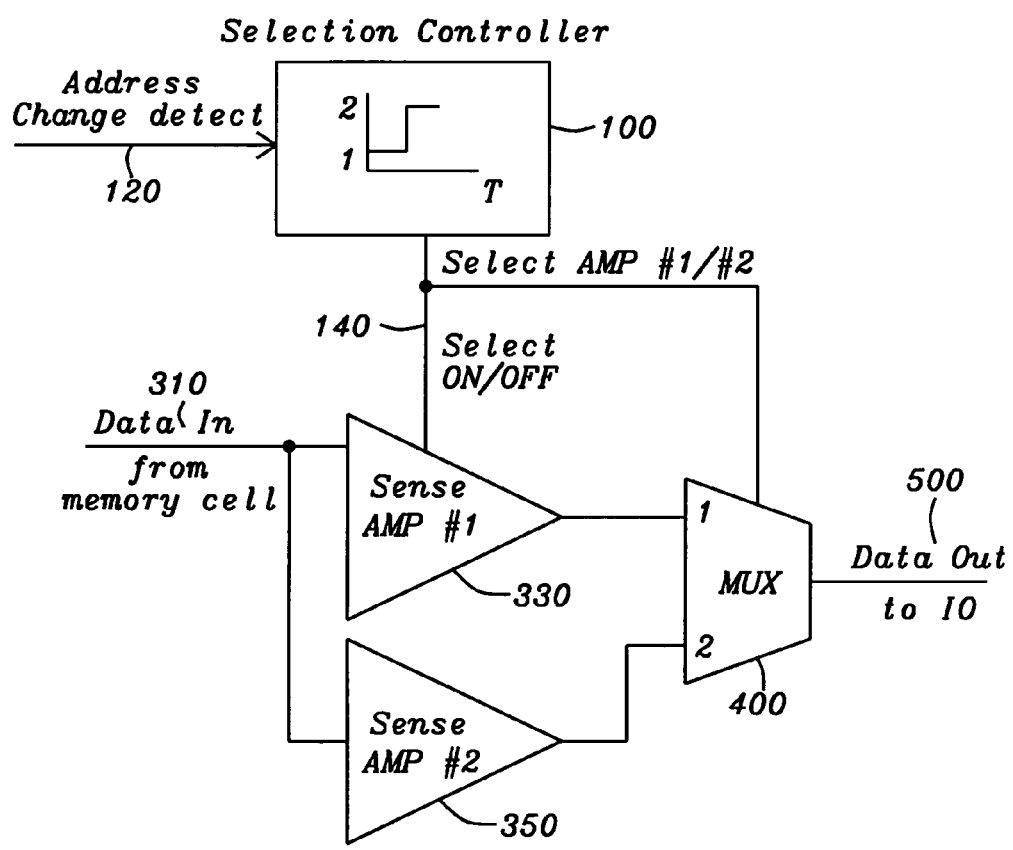
FIG. 2A shows a simplified electrical circuit diagram for the new dynamically adapted sense amplifiers circuit for Sense Electronics Endowed (SEE) memory devices, enhanced by an additional, address change controlled selection unit for said sense electronics as preferred embodiment of the present invention implementable with a variety of modern monolithic integrated circuit technologies.

Contemplating now FIG. 2A, a simplified circuit diagram of the new circuit for the dynamical adapting of memory sense amplifiers for SEE-memory devices is depicted. Referring to FIG. 1 prior art the position of the Sense Amplifiers 30 is between the memory matrix 15, connected to the bit lines 11 for bit data input, and the Read/Write Circuits 40 finally leading forward to the Data Input/Output 50 bus lines. Coming back now to FIG. 2A this same Sense Amplifier—now splitted into two: Sense AMP #1 (item 330) and Sense AMP #2 (item 350) and further on still named together as Sense AMP- reads Data in from memory cells via line 310, amplifying the data just read and feeding them via the amplifier outputs to a multiplexer unit MUX (item 400) to corresponding data output bus lines Data IO 500. The amplifier Sense AMP #1 330 and that multiplexer MUX 400 are both additionally controlled according to the invention by an input signal line 140 delivering dynamical control commands to said Sense AMP #1 330 and to said multiplexer MUX 400. These dynamical control commands are delivered from said additional control element, containing the dynamically operating amplifier response selecting circuit 100 for a Select Amplifier #1/#2 or Select ON/OFF signal 140 with time T dependent characteristics, mainly introducing a time delay for switching between said Sense Amplifiers and selecting the input of said multiplexer MUX 400 as shown in block 100 of FIG. 2A. Said dynamically operating amplifier response selecting circuit 100 is separately controlled by an address change detect signal via input 120, furnished from a separate standard address transition detection circuit.

Figure 2B:
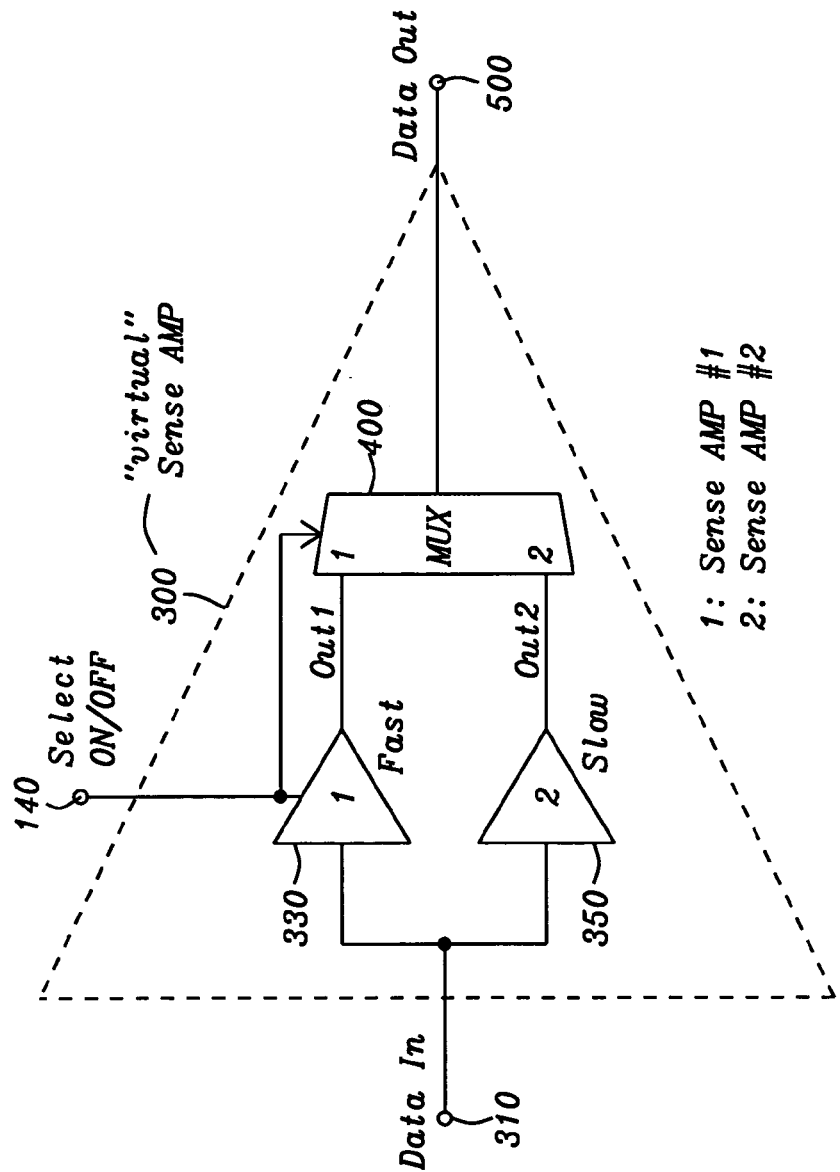
FIG. 2B shows a symbolic circuit diagram with the essential three components of sense electronics for that new dynamically adapted sense amplifiers circuit for Sense Electronics Endowed (SEE) memory devices.
Figure 2C:
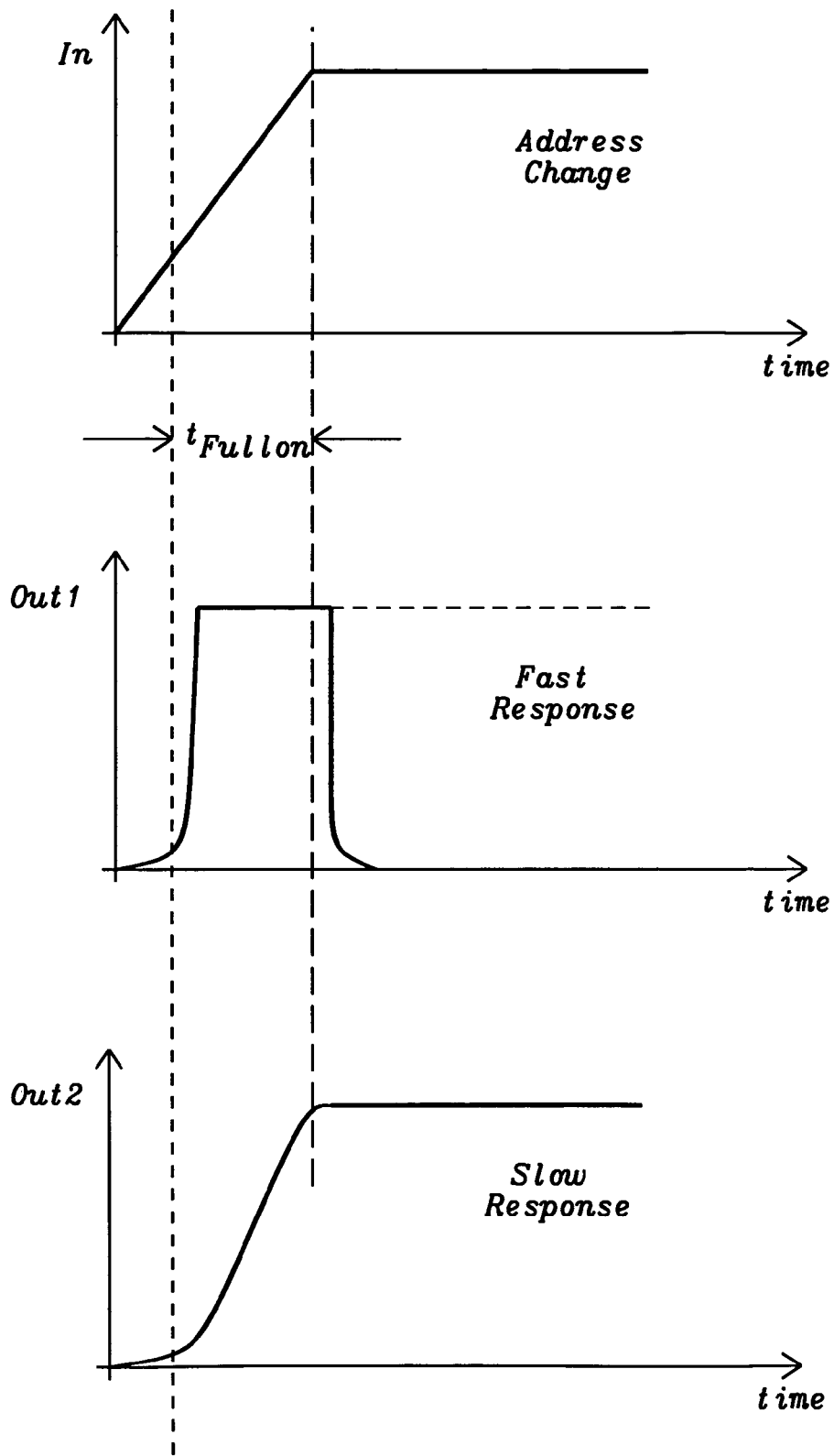
FIG. 2C shows a time diagram for signals "Address Change", "Out1" and "Out2" during the starting phase of a memory read operation of the new dynamically adapted sense amplifiers circuit for Sense Electronics Endowed (SEE) memory devices.

In FIG. 2B another picture is given, showing the combined sense amplifier named as Sense AMP (item 300) within the above description for FIG. 2A. In order to explain the properties of its different amplifier stages, also FIG. 2C is needed, showing step response signals Out1 and Out2 for these amplifier stages and a possible run of the curve as time function of an Address Change signal. These two figures are now explained together: in FIG. 2B a single, virtual amplifier, earlier already called Sense AMP is drawn incorporating said two items Sense AMP #1 (item 330) and Sense AMP #2 (item 350) and also said multiplexer item MUX 400; the amplifiers are both fed by an input signal Data In 310 and additionally designated with labels Fast (1) and Slow (2) delivering their output signals Out1 and Out2 into said multiplexer MUX 400 at its inputs (1) and (2) respectively, said multiplexer MUX 400 additionally controlled by a signal Select ON/OFF 140 thus furnishing an output signal Data Out 500 accordingly. The designations Fast (1) and Slow (2) are referring to the different frequency characteristics of said two amplifiers or better phrased, referring to their Fast (1) and Slow (2) step response behavior i.e. said first amplifier having a wide band frequency characteristic thus exhibiting a fast step response and said second amplifier having a much smaller, low band frequency characteristic thus exhibiting only a slow step response. All this being accompanied by the fact, that the fast response is achieved on cost of higher current (and thereby higher power) consumption, resulting in the following short notion: a fast amplifier is drawing high currents, a slow amplifier needs only low currents.

FIG. 2C is illustrating this behavior by showing the respective output signals from the amplifiers Out1 as Fast Response and Out2 as Slow Response and also additionally demonstrating that Sense AMP #1 330 is only operating during a time period with duration $t_{FullOn}$, namely the time during which the Address Change signal is changing its state, separately evaluated with said Address Change detect signal 120 and extra Selection Controller 100 circuit, as shown in FIG. 2A. For all skilled in the art it is evident, that these measures are very economic in matters of power consumption for said virtual Sense AMP 300, as shown in FIG. 2B. When the address is changed, the virtual sense amplifier Sense AMP 300 shall be fully operative i.e. attain the full operating speed. After a certain "on" time $T=t_{FullOn}$, when the output signal of said virtual sense amplifier Sense AMP 300 has nearly reached its final value, the operating speed can be reduced. This can be done by deselecting the Fast Response Sense AMP #1 and leaving the remaining operation alone to the Slow Response Sense AMP #2, switching the output signals accordingly by said multiplexer MUX 400. When to reduce the operating speed can either be determined only by a fixed time duration T or another time rule. A summary of the ways of working for the circuit using dynamically operating of sense amplifiers can be formulated as such: the sense amplifiers are fully responsive in the beginning of a read cycle to make the memories react fast. After this initial "on" time the reaction speed is reduced until the next address change occurs, because in the meantime no data change needs to be sensed. In other words, when an address change occurs at a memory cell, the bit line input signal of the amplifier reading the memory data is rising from zero voltage and for small values a fast "powerful" virtual sense amplifier is necessary i.e. the amplifier has to be turned fully "on" (small delay times always to be accounted for) and after a certain "on" time—which is depending on the particular memory cell specifications but can be determined as a fixed time—the bit line input signal level has changed to higher values, thus this fast "powerful" virtual sense amplifier is not needed any more, a slower virtual sense amplifier will do now for that situation.

Figure 2D:
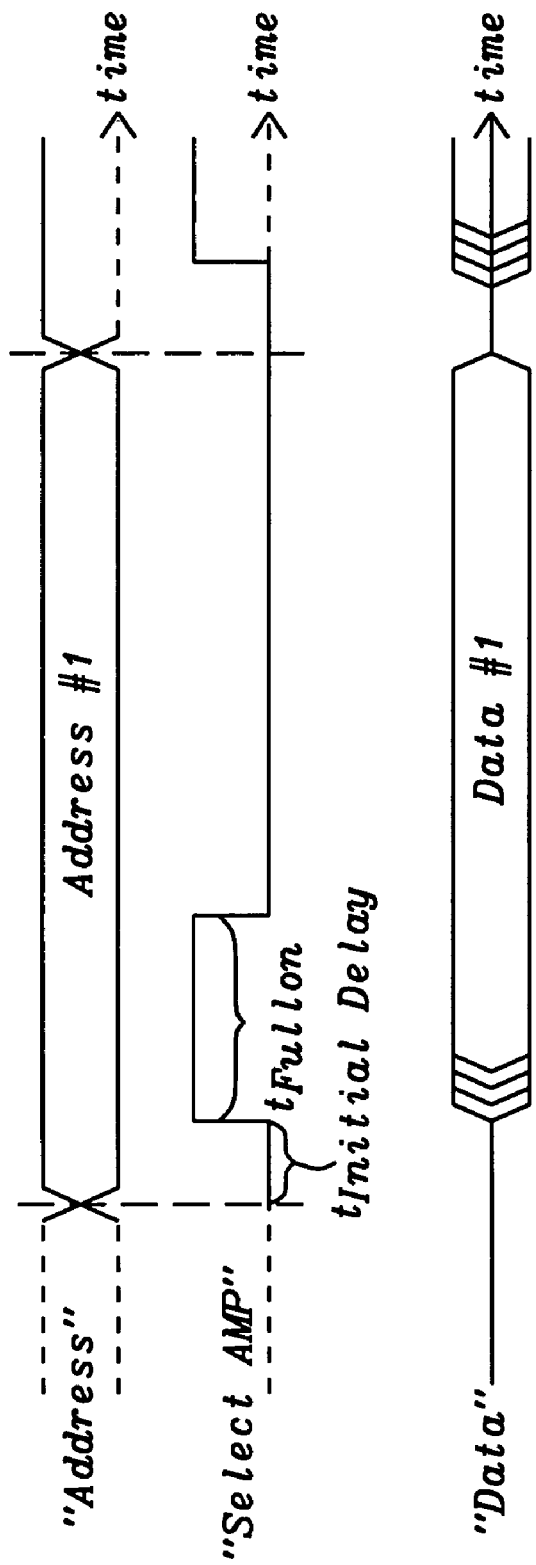
FIG. 2D shows a timing diagram for the three relevant signals "Address", "Select AMP" and "Data" during a read cycle of the new dynamically adapted sense amplifiers circuit for Sense Electronics Endowed (SEE) memory devices.

FIG. 2D shows a timing diagram for the three relevant signals "Address", "Select AMP" and "Data" during a read cycle for one bit of a data word of the memory, wherein the run of the curve for the "Select AMP" demonstrates after an "Address" signal change and said initial delay time $t_{InitialDelay}$ said full speed operation of said virtual sense amplifier during $t_{FullOn}$ with the following speed reduction as depicted. During such a read cycle all data bits of one data word of the memory are read out in parallel in a similar fashion. These read cycle operations for dynamical operating of virtual memory sense amplifiers are regularly controlled by clock signals from the embedding microprocessor system and specified in this context as "System Clock" signal.

Figure 3A:
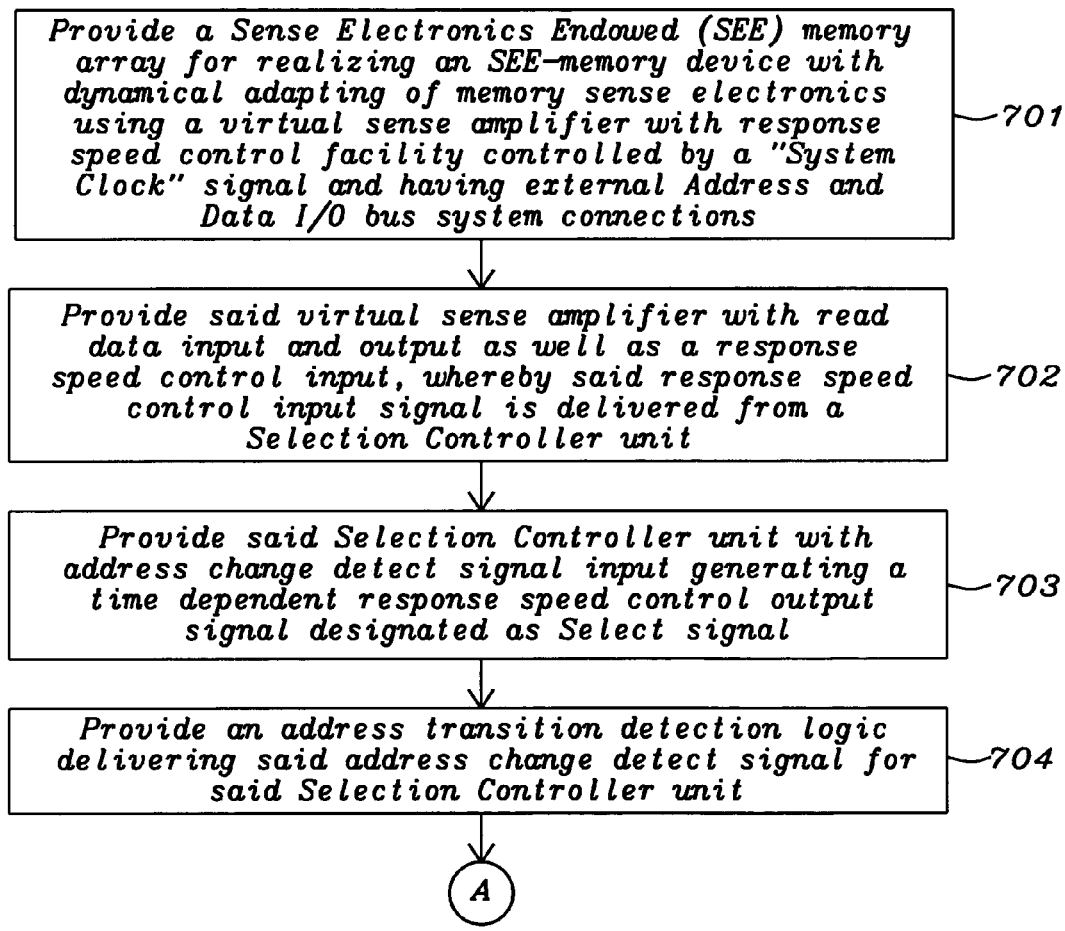
FIGS. 3A & 3B describe with the help of a flow diagram the according method for constructing and operating a circuit for said dynamical adapting of memory sense amplifiers for SEE-memory devices as shown in FIG. 2A.
Figure 3B:
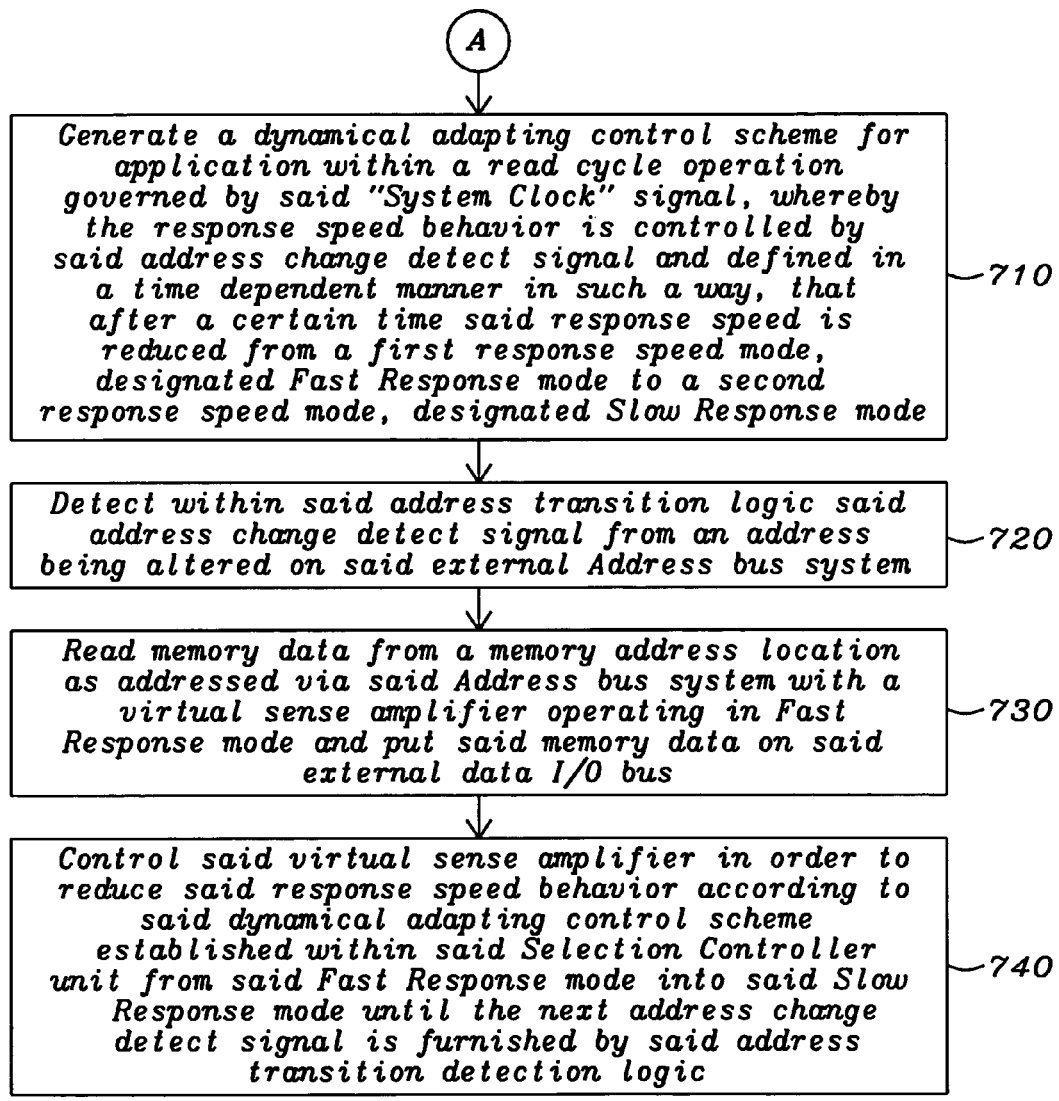

Regarding the flow diagram given in FIGS. 3A & 3B, a method, explaining the operation of the novel circuit for dynamical adapting e.g. the response speed of virtual memory sense amplifiers for Sense Electronics Endowed (SEE) memory devices according to the invention and exemplified in FIG. 2A is now described and defined by its steps, wherein the first step 701 provides e.g. a Random Access Memory (RAM) array using a virtual sense amplifier with response speed control facility controlled by a "System Clock" signal and having external Address and Data I/O bus system connections. Step 702 then provides said virtual sense amplifier with read data input and output as well as a response speed control input, named furtheron also Select input, whereby said Select input is delivered from a Selection Controller unit, step 703 provides said Selection Controller unit with an Address Change detect signal input generating said time dependent Select input signal as output, and step 704 provides an address transition detection logic delivering said Address Change detect signal for said Selection Controller unit. With step 710 a dynamical adapting response speed control scheme for application within a read cycle operation is generated, governed by said "System Clock" signal, whereby said response speed is indirectly controlled by said Address Change detect signal and defined in a time dependent manner in such a way, that after a certain "on" time said response speed is reduced from a first response speed mode, designated Fast Response mode to a second response speed mode, designated Slow Response mode. Directly used for response speed control is said Select input control signal coming from said Selection Controller unit and also designated as "Select AMP" or "Select ON/OFF" signal. Step 720 detects within said address transition logic said Address Change detect signal from an address being altered on said external Address bus system.

Step 730 then reads memory data from a memory address location as addressed via said Address bus system with a virtual sense amplifier operating in Fast Response mode and puts said memory data on said external data I/O bus. Slow Response mode of said virtual sense amplifier is set up in step 740 in order to reduce said fast response speed of said Fast Response mode according to said dynamical response speed control scheme established within said Selection Controller unit until the next address change detect signal is furnished by said address transition detection logic.

Figure 4A:
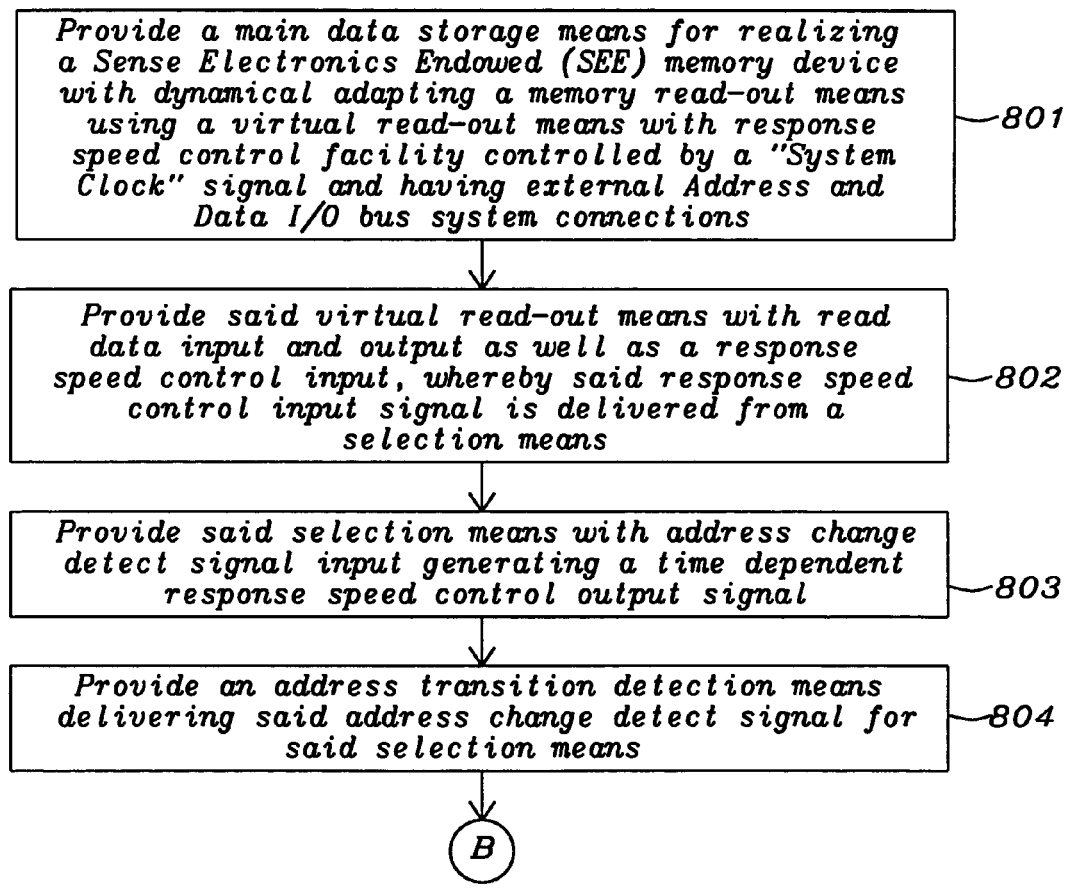
FIGS. 4A & 4B explain with the help of another flow diagram a more general method for constructing and operating a circuit for dynamical adapting of memory sense amplifiers for SEE-memory devices.
Figure 4B:
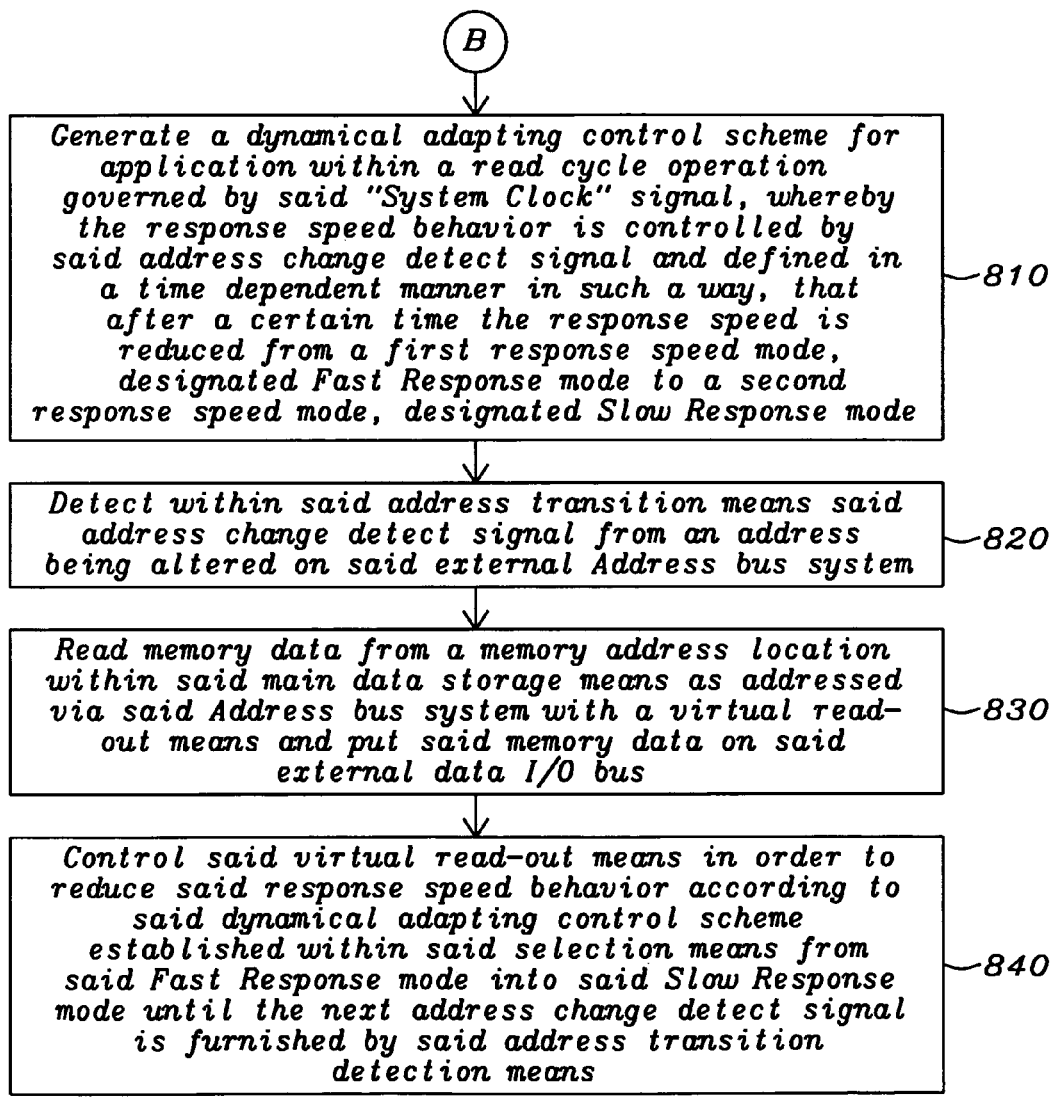

Regarding now the flow diagram given in FIGS. 4A & 4B, a somewhat more general method is now described, explaining the operation of a novel circuit for dynamical adapting the memory read-out means for a Sense Electronics Endowed (SEE) memory device according to the invention and its steps defined, wherein as first step 801 a main data storage means is provided for realizing an SEE-memory device with dynamical response speed adaptation of a memory read-out means using a virtual read-out means with a response speed control facility normally controlled by the main "System Clock" signal and having external Address and Data I/O bus system connections. Steps 802, 803 and 804 provide said virtual read-out means with read data input and output as well as a response speed control input, whereby said response speed control input is delivered from a selection means, said selection means with address change detect signal input generating a time dependent response speed control output signal, and an address transition detection means delivering said address change detect signal for said selection means. Step 810 generates a dynamical adapting control scheme for application within a read cycle operation governed by said "System Clock" signal, whereby the response speed behavior is controlled by said Address Change detect signal and defined in a time dependent manner in such a way, that after a certain "on" time the response speed is reduced from a first response speed mode, designated Fast Response mode to a second response speed mode, designated Slow Response mode. Step 820 detects within said address transition means said address change detect signal from an address being altered on said external Address bus system. Step 830 then reads memory data from a memory address location within said main data storage means as addressed via said Address bus system with a virtual read-out means and puts said memory data on said external data I/O bus and finally step 840 sets the response speed behavior for said memory read-out means in order to reduce said response speed according to said dynamical adapting control scheme established within said selection means from said Fast Response mode into said Slow Response mode until the next address change detect signal is furnished by said address transition detection means.

Summarizing the essential operational features of the circuit we find, that the circuit of the present invention implements a method, whereby the response speed for the sense amplifiers of memory devices is reduced during low power mode of a system equipped with such memory and thus said memory is only operating at full power and highest speed for a certain time after an address change occurred.

As shown in the preferred embodiments and evaluated by circuit analysis, the novel system, circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, realizing a Sense Electronics Endowed (SEE) memory device with dynamical adapting of memory sense amplifiers, comprising:
    a memory array for realizing an SEE-memory device with dynamical adapting of memory sense amplifiers using a virtual sense amplifier with response speed control facility controlled by a "System Clock" signal and having external Address and Data I/O bus system connections;
    a virtual sense amplifier with read data input and output as well as a response speed control input, whereby a response speed control signal for said response speed control input is delivered from a Selection Controller unit;
    a Selection Controller unit with Address Change detect signal input generating a time dependent response speed control signal as output; and
    an address transition detection logic delivering said Address Change detect signal for said selection controller unit, whereby said Address Change detect signal is generated from an address being altered on said external Address bus system, then causing the reading of memory data from a memory address location as addressed via said Address bus system with a fully powered virtual sense amplifier and putting said memory data on said external data I/O bus, whereas said virtual sense amplifier is now modified into a reduced response speed mode configuration in order to reduce its power consumption according to a dynamical response speed control scheme established within said Selection Controller unit until the next Address Change detect signal is furnished by said address transition detection logic and said dynamical response speed control scheme for application within a read cycle operation governed by said "System Clock" signal; the dynamical response speed control scheme being generated so, that the response speed is controlled by said Address Change detect signal and defined in a time dependent manner reducing after a certain time the response speed characteristic of said virtual sense amplifier.

2. The circuit according to claim 1 wherein said Sense Electronics Endowed (SEE) memory device is realized using Dynamic-RAM.

3. The circuit according to claim 1 wherein said Dynamic-RAM is manufactured in bipolar technology.

4. The circuit according to claim 1 wherein said Dynamic-RAM is manufactured in CMOS technology.

5. The circuit according to claim 1 wherein said Sense Electronics Endowed (SEE) memory device is realized using Static-RAM.

6. The circuit according to claim 5 wherein said Static-RAM is manufactured in bipolar technology.

7. The circuit according to claim 5 wherein said Static-RAM is manufactured in CMOS technology.

8. The circuit according to claim 1 wherein said Sense Electronics Endowed (SEE) memory device is realized using Flash-memory.

9. The circuit according to claim 1 wherein said Sense Electronics Endowed (SEE) memory device is realized using Magnetic-RAM.

10. The circuit according to claim 1 wherein said Sense Electronics Endowed (SEE) memory device is realized using Ferroelectric-RAM.

11. The circuit according to claim 1 manufactured using modern integrated circuit technologies.

12. The circuit according to claim 1 manufactured as a monolithic integrated circuit.

13. The circuit according to claim 1 manufactured as integrated circuit in monolithic CMOS technology.

14. A circuit, realizing a Sense Electronics Endowed (SEE) memory device with dynamical adapting of memory read-out, comprising:
- main data storage means for realizing a Sense Electronics Endowed (SEE) memory device with dynamical response speed adaptation of memory read-out means using a memory read-out means with response speed control facility controlled by a "System Clock" signal and having external Address and Data I/O bus system connections;
- memory read-out means with read data input and output as well as a response speed control input, whereby said response speed control input is delivered from a selection means;
- selection means with Address Change detect signal input generating a time dependent response speed control output signal; and
- address transition detection means delivering said Address Change detect signal for said selection means, whereby said Address Change detect signal is generated from an address being altered on said external Address bus system, then causing the reading of memory data from a memory address location as addressed via said Address bus system with a fully powered memory read-out means and finally putting said memory data on said external data I/O bus.

15. The circuit according to claim 14 wherein said main data storage means is realized as Dynamic-RAM.

16. The circuit according to claim 15 wherein said Dynamic-RAM is manufactured in bipolar technology.

17. The circuit according to claim 15 wherein said Dynamic-RAM is manufactured in CMOS technology.

18. The circuit according to claim 14 wherein said main data storage means is realized as Static-RAM.

19. The circuit according to claim 18 wherein said Static-RAM is manufactured in bipolar technology.

20. The circuit according to claim 18 wherein said Static-RAM is manufactured in CMOS technology.

21. The circuit according to claim 14 wherein said main data storage means is realized as Flash-memory.

22. The circuit according to claim 14 wherein said main data storage means is realized as Magnetic-RAM.

23. The circuit according to claim 14 wherein said main data storage means is realized as Ferroelectric-RAM.

24. The circuit according to claim 14 wherein said memory read-out means is a virtual sense amplifier for memory read-out.

25. The circuit according to claim 24 wherein said virtual sense amplifier is capable of being operated in two response speed modes.

26. The circuit according to claim 25 wherein said two response speed modes are as first mode a Fast Response speed mode and as second mode a Slow Response speed mode, said Slow Response speed mode characterized by lower power consumption of said virtual sense amplifier when compared to said Fast Response speed mode.

27. The circuit according to claim 26 wherein said virtual sense amplifier is made up of two sense amplifiers, a first amplifier with Fast Response speed and a second amplifier with Slow Response speed, each used for operation in said first and said second mode respectively and also a multiplexer with two signal inputs, one control input, and one signal output.

28. The circuit according to claim 14 wherein said selection means generates a dynamical adapting control scheme for application within a read cycle operation governed by said "System Clock" signal, whereby the response speed behavior is controlled by said Address Change detect signal and defined in a time dependent manner in such a way, that after a certain "on" time the response speed is reduced from a first response speed mode, designated Fast Response mode to a second response speed mode, designated Slow Response mode.

29. The circuit according to claim 14 manufactured using modem integrated circuit technologies.

30. The circuit according to claim 14 manufactured as a monolithic integrated circuit.

31. The circuit according to claim 14 manufactured as integrated circuit in monolithic CMOS technology.

32. A method for implementing a Sense Electronics Endowed (SEE) memory device with dynamical response speed adaptation of memory read-out means, comprising:
- providing a main data storage means for realizing a Sense Electronics Endowed (SEE) memory device with response speed adaptation of a memory read-out means using a memory read-out means with response speed control facility controlled by a "System Clock" signal and having external Address and Data I/O bus system connections;
- providing said memory read-out means with read data input and output as well as a response speed control input, whereby said response speed control input is delivered from a selection means;
- providing said selection means with address change detect signal input generating a time dependent response speed control output signal;
- providing an address transition detection means delivering said address change detect signal for said selection means;
- generating a dynamical response speed control scheme for application within a read cycle operation governed by said "System Clock" signal, whereby said response speed is controlled by said address change detect signal and defined in a time dependent manner in such a way, that after a certain time said response speed is reduced;
- detecting within said address transition means said address change detect signal from an address being altered on said external Address bus system;
- reading memory data from a memory address location within said main data storage means as addressed via said Address bus system with a memory read-out means operating with full response speed and putting said memory data on said external data I/O bus; and
- modifying said memory read-out means in order to reduce said response speed according to said dynamical response speed control scheme established within said selection means until the next address change detect signal is furnished by said address transition detection means.

33. The method according to claim 32 wherein said main data storage means is realized as Dynamic-RAM.

34. The method according to claim 32 wherein said main data storage means is realized as Static-RAM.

35. The method according to claim 32 wherein said main data storage means is realized as Flash-memory.

36. The method according to claim 32 wherein said main data storage means is realized as Magnetic-RAM.

37. The method according to claim 32 wherein said main data storage means is realized as Ferroelectric-RAM.

38. A method implementing a Sense Electronics Endowed (SEE) memory device with dynamical dynamical response speed adaptation of memory sense amplifiers, comprising:

providing a memory array for realizing an SEE-memory device with dynamical adaptating of memory sense amplifiers using a virtual sense amplifier with response speed control facility controlled by a "System Clock" signal and having external Address and Data IO bus system connections;

providing said virtual sense amplifier with read data input and output as well as a response speed control input, whereby said response speed control input is delivered from a Selection Controller unit;

providing said Selection Controller unit with address change detect signal input generating a time dependent response speed control output signal;

providing an address transition detection logic delivering said address change detect signal for said Selection Controller unit;

generating a dynamical response speed control scheme for application within a read cycle operation governed by said "System Clock" signal, whereby said response speed is controlled by said address change detect signal and defined in a time dependent manner in such a way, that after a certain time said response speed is reduced;

detecting within said address transition logic said address change detect signal from an address being altered on said external Address bus system;

reading memory data from a memory address location as addressed via said Address bus system with virtual sense amplifier operating with full response speed and putting said memory data on said external data I/O bus; and adapting said virtual sense amplifier in order to reduce said response speed according to said dynamical response speed control scheme established within said selection controller unit until the next address change detect signal is furnished by said address transition detection logic.

* * * * *

UNITED STATES PATENT AND TRADEMARK OFFICE
CERTIFICATE OF CORRECTION

PATENT NO. : 7,079,447 B2  Page 1 of 1
APPLICATION NO. : 10/970784
DATED : July 18, 2006
INVENTOR(S) : Thomas Aakjer It is certified that error appears in the above-identified patent and that said Letters Patent is hereby corrected as shown below:

Title page, item Assignee (73), delete the Assignee's address " Kirchheim-Kabern (DE)" and replace with -- Kirchheim/Teck-Nabern (DE) --.

Add --(74)Attorney, Agent or Firm - George O. Saile; Stephen B. Ackerman --

Signed and Sealed this

Tenth Day of April, 2007

JON W. DUDAS
*Director of the United States Patent and Trademark Office*